(12) United States Patent
Rau et al.

(10) Patent No.: US 7,551,375 B2
(45) Date of Patent: Jun. 23, 2009

(54) PROCESS FOR CONNECTING AN OPTICAL ELEMENT OF A MICROLITHOGRAPHIC PROJECTION EXPOSURE APPARATUS TO A MOUNT, AND ASSEMBLY

(75) Inventors: Johannes Rau, Gerstetten (DE); Josef Distl, Oberkochen (DE); Armin Schoeppach, Aalen (DE); Hubert Holderer, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 324 days.

(21) Appl. No.: 11/386,236

(22) Filed: Mar. 21, 2006

(65) Prior Publication Data

US 2006/0243779 A1 Nov. 2, 2006

(30) Foreign Application Priority Data

Mar. 22, 2005 (DE) .................. 10 2005 013 187

(51) Int. Cl.
*G02B 7/02* (2006.01)
(52) U.S. Cl. ....................... 359/819; 359/820
(58) Field of Classification Search ......... 359/819–824, 359/649
See application file for complete search history.

(56) References Cited

U.S. PATENT DOCUMENTS

| | | | |
|---|---|---|---|
| 3,839,780 A | 10/1974 | Freedman et al. ........... 228/249 |
| 4,726,507 A | 2/1988 | Landram .................. 228/124.1 |
| 4,863,090 A | 9/1989 | Lippey ........................ 228/116 |
| 6,392,824 B1 * | 5/2002 | Holderer et al. ............. 359/819 |
| 6,768,600 B2 * | 7/2004 | Dieker ........................ 359/820 |

FOREIGN PATENT DOCUMENTS

| | | |
|---|---|---|
| DE | DD 107 892 | 8/1974 |
| DE | 197 35 760 | 2/1999 |
| DE | 11 02 032 | 3/2001 |
| EP | 0253561 | 1/1988 |

* cited by examiner

*Primary Examiner*—Mohammed Hasan
(74) *Attorney, Agent, or Firm*—Fish & Richardson P.C.

(57) ABSTRACT

The invention relates to processes for connecting an optical element of a microlithographic projection exposure apparatus to a mount, and also relates to an assembly. A process includes the following steps: forming a substance mixture at a processing temperature from at least a first component, which is solid at the processing temperature, and a second component, which is liquid at the processing temperature, the first component being dispersed in the second component, introducing the substance mixture in the unset state between the optical element and the mount, and setting the substance mixture so as to form a diffusion alloy from the first and second components.

27 Claims, 5 Drawing Sheets

PROCESS FOR CONNECTING AN OPTICAL ELEMENT OF A MICROLITHOGRAPHIC PROJECTION EXPOSURE APPARATUS TO A MOUNT, AND ASSEMBLY

CROSS-REFERENCE TO RELATED APPLICATION

This application claims priority of German patent application No. 10 2005 013 187.5 filed Mar. 22, 2005.

BACKGROUND OF THE INVENTION

1. Field of the Invention

The invention relates to processes for connecting an optical element of a microlithographic projection exposure apparatus to a mount, and also relates to an assembly.

2. Description of the Related Art

It is known to use adhesive bonding processes to connect optical devices, such as lenses, mirrors or prisms, to metallic or ceramic mounts. However, these processes have the drawback that there is a risk of the optical device moving off-center and of stresses occurring between the optical device and the mount during the heat treatment of the adhesive. Further problems result from the low UV resistance of the adhesive and from creep and relaxation effects (setting shrinkage, post-setting effects, chemical instability) and also long-term properties that are difficult to predict.

These problems are particularly serious when mounting optical components for example in a microlithographic projection exposure apparatus, as is used for the photolithographic production of very fine structures, such as semiconductor components, and in which high-precision mounting of the optical devices with long-term stability is particularly important.

DE 197 35 760 A1 has disclosed a process for fitting optical, transparent components to metal mounts and mounted assemblies without using organic materials of this type. The transparent material, in particular quartz glass or calcium fluoride, is provided, in the region of the connection, with a coating which is able to ensure bonding between a solder alloy and the transparent material. To produce the connection, the coated transparent device and the mount, which has previously been provided with the solder alloy, are positioned on one another, jointly heated in a furnace to the melting temperature of the solder and then cooled.

U.S. Pat. No. 3,839,780 has disclosed a process for connecting metal devices, in particular aluminum devices, using intermetallic compounds formed from a first metal (mercury, gallium or indium) and a second, more noble metal, such as copper, gold, nickel, silver or palladium, which is supposed to ensure a good thermal and electrical conductivity between the metal devices. To prevent premature alloy formation from the components of the intermetallic compound, first of all a paste of these components which has solidified or "frozen" through cooling is introduced between the metal devices, and then the entire arrangement is heated in order to form the fixed bond. According to an alternative process, one of the components (e.g. comprising copper or gallium), which is in solid, pulverized form, is temporarily provided with a coating (e.g. of gallium oxide or copper oxide), which is subsequently mechanically broken open. According to a further alternative process, the two components (e.g. gallium and copper) are separately deposited, for example by electroplating, on the device surfaces to be connected, after which the device surfaces are brought into contact with one another and heated in order to form the connection.

Furthermore, U.S. Pat. No. 4,863,090 has disclosed the connection of two devices (e.g. electronic devices or optical components) by means of a process in which first of all in each case a gold layer is applied to the devices, which have been provided with a barrier layer (e.g. of nickel), and then each of the devices together with the associated layers is separately partially immersed in a mercury bath, so that a mercury/gold amalgam is in each case formed by diffusion at the respective surface. Then, the devices are joined together using the surfaces that have been coated in this way under the application of pressure.

SUMMARY OF THE INVENTION

It is an object of the present invention to provide an alternative process for connecting an optical element of a microlithographic projection exposure apparatus to at least one optical element held in a mount, in which an accurate connection with long-term stability is produced between the devices with relatively little process outlay.

It is a further object of the present invention to provide a corresponding assembly of a microlithographic projection exposure apparatus.

The above objects are achieved by the features of the independent claims 1, 4.

A process according to the invention for connecting an optical element of a microlithographic projection exposure apparatus to a mount having bearing elements for bearing the optical element includes the following steps:

forming a substance mixture at a processing temperature from at least a first component, which is solid at the processing temperature, and a second component, which is liquid at the processing temperature, the first component being dispersed in the second component;

introducing the substance mixture in the unset state between the optical element and the mount; and setting the substance mixture so as to form a diffusion alloy from the first and second components.

During the setting process which takes place in the process according to the invention, the two components, after they have been introduced between the optical element and the mount, diffuse into one another to form a diffusion alloy and thereby form an alloy which has a significantly higher melting point than the second component (i.e. the low-melting component which is liquid at the processing temperature).

The optical element may be either a nonmetallic optical element, for example a lens, e.g. made from quartz glass (fused silica, $SiO_2$) or calcium fluoride ($CaF_2$), or a metallic optical element, such as a mirror consisting for example of aluminum or a mirror which includes or comprises aluminum.

In the context of the invention, a diffusion alloy is to be understood as meaning an alloy which can form at temperatures below the melting point of at least one of the individual components. Therefore, diffusion at the processing temperature results in the formation of a more or less homogeneous alloy with a melting point which can be well above the processing temperature, with the diffusion alloy formed having a relatively high strength and good thermal conductivity and chemical stability.

The process in particular obviates the need for joint heating of the components of the diffusion alloy together with the devices to be joined and thereby eliminates the risk, associated with heating and subsequent cooling processes, of stresses being introduced into the assembly formed from the devices, since the processing temperature (which is dependent on the selection of the combination of low-melting and high-melting components) need not be exceeded throughout the entire joining process.

Depending on the combination of components selected, the formation of the diffusion alloy and the entire joining process may in particular take place at processing temperatures in the vicinity of room temperature, as will become clear below on the basis of preferred configurations of the invention.

It is preferable for the temperature of the arrangement to be increased by in total less than 10° C., even more preferably less than 5° C., during the process according to the invention (up until the point at which formation of the diffusion alloy has been completed). In particular, the temperature of the arrangement can even be kept substantially constant up until the point at which the formation of the diffusion alloy is complete.

According to a preferred embodiment, a maximum temperature of the arrangement of 50° C., preferably of 35° C., is not exceeded during the process steps according to the invention. In this way, in particular for the preferred application for the connection of optical components (e.g. lens, mirror, prism or diffractive optical element) to (e.g. metallic or ceramic) mounts, the formation of stresses as a result of excessive heating and cooling processes is counteracted, and the high accuracy requirements for example in a microlithographic projection exposure apparatus can be satisfied, in particular with imaging errors which result from off-center or stress effects being avoided.

The drawbacks described above associated with the conventional adhesive-bonding processes, in particular long-term instability, are likewise avoided.

According to a preferred embodiment, the second component used is gallium (Ga) or a gallium alloy, in particular a gallium-tin (Ga—Sn) alloy or a gallium-indium (Ga—In) alloy, or a component comprising materials of this type. If a gallium alloy is used, the gallium content of the gallium alloy is preferably at least 75 percent by weight. According to a preferred embodiment, the gallium content of the gallium alloy is selected in such a way that the mixing ratio in the gallium alloy substantially corresponds to the mixing ratio of an eutectic mixture.

The use according to the invention of gallium for the component which is liquid at the processing temperature has a number of advantages:

For example, firstly the melting point ($T_m \approx 30°$ C.) of gallium is well below the melting point of various other elements which may be considered for the formation of the diffusion alloy according to the invention, such as for example indium ($T_m \approx 150°$ C.), so that the processing temperature can in particular be selected to be less than 35° C. if gallium is used. It has been found that the mixture of substances formed in accordance with the invention, after dispersion of the first, high-melting component (e.g. copper particles) in gallium, is in the unset state for a sufficient processing time even at temperatures down to as low as approximately 20° C., so that in the process according to the invention it is feasible to employ processing temperatures of in particular below 25° C., i.e. for example at room temperature. If a gallium alloy is used, it is possible to further reduce the melting point $T_m$ of the first component, in particular to less than 20° C.

Since gallium has relatively good bonding properties to for example glass, it is possible to dispense with the use of an additional bonding layer when connecting for example lenses or prisms to their mounts, and thereby to reduce the process outlay. According to a preferred embodiment of the invention, therefore, the diffusion alloy is formed in direct contact or bonding contact with the optical element. In this way, the process outlay is reduced by the elimination of an additional bonding layer arrangement. Depending on the specific conditions, however, it may nevertheless be advantageous to apply an additional bonding layer, e.g. of chromium or another suitable, in particular metallic material, to the optical element device, in order on the one hand to increase the bonding but on the other hand also to bind any material of the second low-melting component (i.e. for example gallium) which may be present in excess after setting and to prevent it from being liquefied again during heating (e.g. to temperatures of over 30° C. in the case of gallium).

As a further advantage, gallium—unlike mercury for example—is nontoxic, and on account of its low vapor pressure compared to mercury there is no significant risk of contamination even when used under high purity requirements, i.e. for example in a microlithographic projection exposure apparatus.

Alternatively, albeit less preferably, the process according to the invention can also be realized using a suitable material other than gallium, for example indium or mercury or a corresponding indium or mercury alloy, for the second, low-melting component.

According to a preferred embodiment, the second component forms at least 35 percent by weight, and preferably from 60 to 80 percent by weight, of the mixture of substances formed from at least the first component and the second component, in order to achieve an optimum compromise between good processing properties (in the sense of a mixture of substances with a sufficiently low viscosity in the unset state) and, at the same time, sufficiently fast setting.

If the process is used to connect, for example, lenses or prisms to their mounts without an additional bonding layer, the further addition of titanium (Ti), zirconium (Zr), hafnium (Hf) or indium as active components is advantageous. The addition of small quantities, selected according to the specific requirements, of silicon (Si), germanium (Ge), antimony (Sb) or phosphorus (P), moreover, can be used to influence the mechanical properties (proof stress, creep properties, etc.). Moreover, adding small quantities, selected according to the specific requirements, of gold (Au), silver (Ag), copper (Cu), Nickel (Ni), palladium (Pd), indium (In), bismuth (Bi), tin (Sn) or zinc (Zn) can also be used for desired control of the processing and setting temperatures and the setting rate.

It is preferable for the first component used to be an element with a face-centered cubic crystal structure, in which case relatively rapid setting (compared to elements with a body-centered cubic crystal structure, such as tantalum (Ta), chromium (Cr) or molybdenum (Mo)) can be achieved, it being possible if desired to reduce the setting rate, for example, as described above, by the addition of tin (Sn).

According to a preferred embodiment, the first, high-melting component is copper (Cu), which can be used, for example in combination with gallium, to form a diffusion alloy that is thermally stable up to temperatures of over 500° C. However, as an alternative it is also possible, for example, to use nickel (Ni), gold (Au), silver (Ag) or palladium (Pd) or a material containing at least one of these elements. Furthermore, the use of carbon (C), silicon (Si) or germanium (Ge) may also be considered, preferably as an additive. Furthermore, the first component used may also be a steel powder, which is preferably (for example as a result of the addition of chromium) substantially stainless or corrosion-resistant in a general sense. By way of example, iron-nickel-chromium or iron-nickel-chromium-cobalt alloys are suitable.

The optical element (e.g. a device formed from nonmetallic material), prior to the step of forming the diffusion alloy, may be provided with a layer structure comprising bonding layer and/or a diffusion barrier layer and/or a metallic layer, with the diffusion alloy preferably being formed in the region of the layer structure.

According to a further aspect of the present invention, a process for connecting two devices, of which one device is an optical element of a microlithographic projection exposure apparatus and the other device is a mount with bearing elements for bearing this optical element, includes the following steps:

coating at least one first device of the devices in the region of an intended joining location with a first component which has a first melting temperature;

providing a second component, which is in the solid state and has a second melting temperature that is lower than the first melting temperature; and joining together the first device, which has been coated with the first component, the second component, which is in the solid state, and the second device in the region of the joining location, in such a manner as to form a diffusion alloy from the first and second components, the diffusion alloy having a melting temperature which is higher than the second melting temperature.

According to this embodiment too, the two components, after they have been introduced between the two devices, diffuse into one another so as to form a diffusion alloy and thereby form an alloy which has a significantly higher melting point than the second component (i.e. the low-melting component that is liquid at the processing temperature). As in the embodiment described above, one of the components of the subsequent diffusion alloy (in this case the second, low-melting component) is introduced in the solid state between the devices that are to be connected. Therefore, the diffusion alloy once again produces a diffusion alloy that is stable in the long term and has a melting point well above the processing temperature, which depending on the choice of components may as described above be less than for example 35° C. and in particular may be room temperature, by means of a process which can be carried out relatively easily and in particular without stresses and contamination during the connection of optical components.

The statements made above in connection with advantageous configurations, for example with regard to temperatures, materials, etc., apply in a corresponding way to this variant too. For example, in this case too, the diffusion alloy can be formed in direct contact with the optical element (which may be formed from nonmetallic or metallic material). The second component, which is in the solid state, may in particular be provided in the form of a foil.

The formation of the diffusion alloy may take place both after heating to or beyond the melting temperature of the second component or at a temperature below the melting temperature of the second component.

The second component used is once again preferably gallium (Ga) or a gallium alloy, for example a gallium-tin (Ga—Sn) alloy, or a gallium-indium (Ga—In) alloy or a component comprising materials of this type. If a gallium alloy is used, the gallium content of the gallium alloy is preferably at least 75 percent by weight. According to a preferred embodiment, the gallium content of the gallium alloy is selected in such a way that the mixing ratio in the gallium alloy substantially produces an eutectic mixture.

The first component used may be a material with a face-centered cubic crystal structure. In particular, the material used for the first component may be copper (Cu), nickel (Ni), gold (Au), silver (Ag) or palladium (Pd), or a material containing at least one of these elements. Furthermore, the first component used may be a substantially stainless or corrosion-resistant steel.

Prior to the step of forming the diffusion alloy, the optical element may be provided with a layer structure comprising bonding layer and/or a diffusion barrier layer and/or a metallic layer, in which case the diffusion alloy is preferably formed in the region of the layer structure.

A further aspect of the invention relates to an assembly of a microlithographic projection exposure apparatus, having at least one optical element held in a mount, and a diffusion alloy containing gallium and/or mercury arranged between the optical element and the mount.

In this case, according to one embodiment, the diffusion alloy is formed from at least a first component, which has a first melting temperature, and a second component, which has a second melting temperature lower than the first melting temperature, and the diffusion alloy has a melting temperature which is higher than the second melting temperature.

According to one embodiment, the diffusion alloy is in direct contact with the optical element.

The optical element may be formed from a nonmetallic material or from a metallic material (e.g. aluminum mirror).

The assembly according to the invention can be produced without stresses and contamination in particular by means of the processes described above, in which case the melting point of the diffusion alloy is well above the processing temperature or is above the temperature at which the diffusion alloy is formed, which, depending on the components selected, as described above, may be below for example 35° C., and in particular may be room temperature.

According to a preferred embodiment, the optical component is a lens, a mirror, a prism or a diffractive optical element.

According to a further embodiment, connecting elements are arranged on the devices in such a way that they form a positively locking connection between the devices after the formation of the diffusion alloy. The connecting elements may in particular be formed integrally with the respective device.

A further aspect of the invention also relates to a microlithographic projection exposure apparatus having an assembly according to the invention.

In general, in another aspect, the invention features a process for connecting an optical element of a microlithographic projection exposure apparatus to a mount having bearing elements for bearing the optical element. The process includes the following steps:

a) forming a substance mixture at a processing temperature from at least a first component, which is solid at the processing temperature, and a second component, which is liquid at the processing temperature, the first component being dispersed in the second component;

b) introducing the substance mixture in the unset state between the optical element and the mount; and c) setting the substance mixture so as to form a diffusion alloy from the first and second components.

Embodiments of the process can include one or more of the following features and/or features of other aspects. For example, prior to the formation of the diffusion alloy, the optical element can be aligned in the mount and held in a position defined by the bearing elements. In some embodiments, after the setting of the diffusion alloy, the aligned optical element is fixed in the position defined by the bearing elements.

In general, in another aspect, the invention features a process for connecting two devices, of which one device is an optical element of a microlithographic projection exposure apparatus and the other device is a mount having bearing elements for bearing this optical element. The process includes the following steps:
a) coating at least one first device of the devices in the region of an intended joining location with a first component which has a first melting temperature;
b) providing a second component, which is in the solid state and has a second melting temperature that is lower than the first melting temperature; and
c) joining together the first device, which has been coated with the first component, the second component, which is in the solid state, and the second device in the region of the joining location, in such a manner as to form a diffusion alloy from the first and second components, the diffusion alloy having a melting temperature which is higher than the second melting temperature.

Embodiments of the process can include one or more of the following features and/or features of other aspects. For example, the temperature of the arrangement including the devices or the optical element and the mount can be increased by less than 10° C., such as less than 5° C., during steps a) to c). A maximum temperature of the arrangement that includes the devices of 50° C., such as 35° C., may not be exceeded during steps a) to c). The processing temperature or the temperature during the formation of the diffusion alloy can be less than 35° C., such as less than 25° C.

The diffusion alloy can be formed in direct contact with the optical element. In some embodiments, in step a) both devices are coated with the first component in the region of the joining location. In step b) the second component, which is in the solid state, can be provided in the form of a foil. The formation of the diffusion alloy can take place after heating to or beyond the melting temperature of the second component. In certain embodiments, the formation of the diffusion alloy takes place at a temperature below the melting temperature of the second component.

The second component can be formed from or can include gallium (Ga) or a gallium alloy. The gallium alloy used can be a gallium-tin (Ga—Sn) alloy or a gallium-indium (Ga—In) alloy. The gallium content of the gallium alloy can be at least 75% by weight. The gallium content of the gallium alloy can be selected in such a way that substantially an eutectic mixture is formed.

The first component used can be a material with a face-centered cubic crystal structure. The first component used can be copper (Cu) or material containing copper. In some embodiments, the first component used is nickel (Ni), gold (Au), silver (Ag) or palladium (Pd) or a material containing at least one of these elements. The first component used can be a substantially stainless or corrosion-resistant steel.

The second component can form at least 35 percent by weight, such as from 60 to 80 percent by weight, of the mixture of substances comprising at least the first component and the second component.

In certain embodiments, prior to step c), the optical element is provided with a layer structure comprising a bonding layer and/or a diffusion barrier and/or a metallic layer, and the diffusion alloy in step c) is formed in the region of the layer structure.

The optical element can substantially include an optically transparent material. The optical element can be substantially formed from a nonmetallic material. The optical element can be a lens, a mirror, a prism or a diffractive optical element.

At least one of the devices, or the optical element and/or the mount, can substantially include a ceramic material and/or a crystalline material.

In general, in a further aspect, the invention features an assembly of a microlithographic projection exposure apparatus, having at least one optical element held in a mount, and a diffusion alloy containing gallium and/or mercury arranged between the optical element and the mount.

Embodiments of the assembly can include one or more of the following features and/or features of other aspects. For example, the diffusion alloy can be formed from at least a first component, which has a first melting temperature, and a second component, which has a second melting temperature lower than the first melting temperature, and the diffusion alloy has a melting temperature which is higher than the second melting temperature. The diffusion alloy can be in direct contact with the optical element. The assembly can be produced by the process featured as other aspects of the invention.

In another aspect, the invention features a microlithographic projection exposure apparatus having the assembly as featured in the foregoing aspect of the invention.

Further configurations of the invention are given in the description below and the appended claims.

BRIEF DESCRIPTION OF THE DRAWINGS

The invention is explained in more detail below on the basis of exemplary embodiments illustrated in the appended figures, in which.

DETAILED DESRIPTION OF PREFERRED EMBODIMENTS

Figures 1, 2, 3, 4:
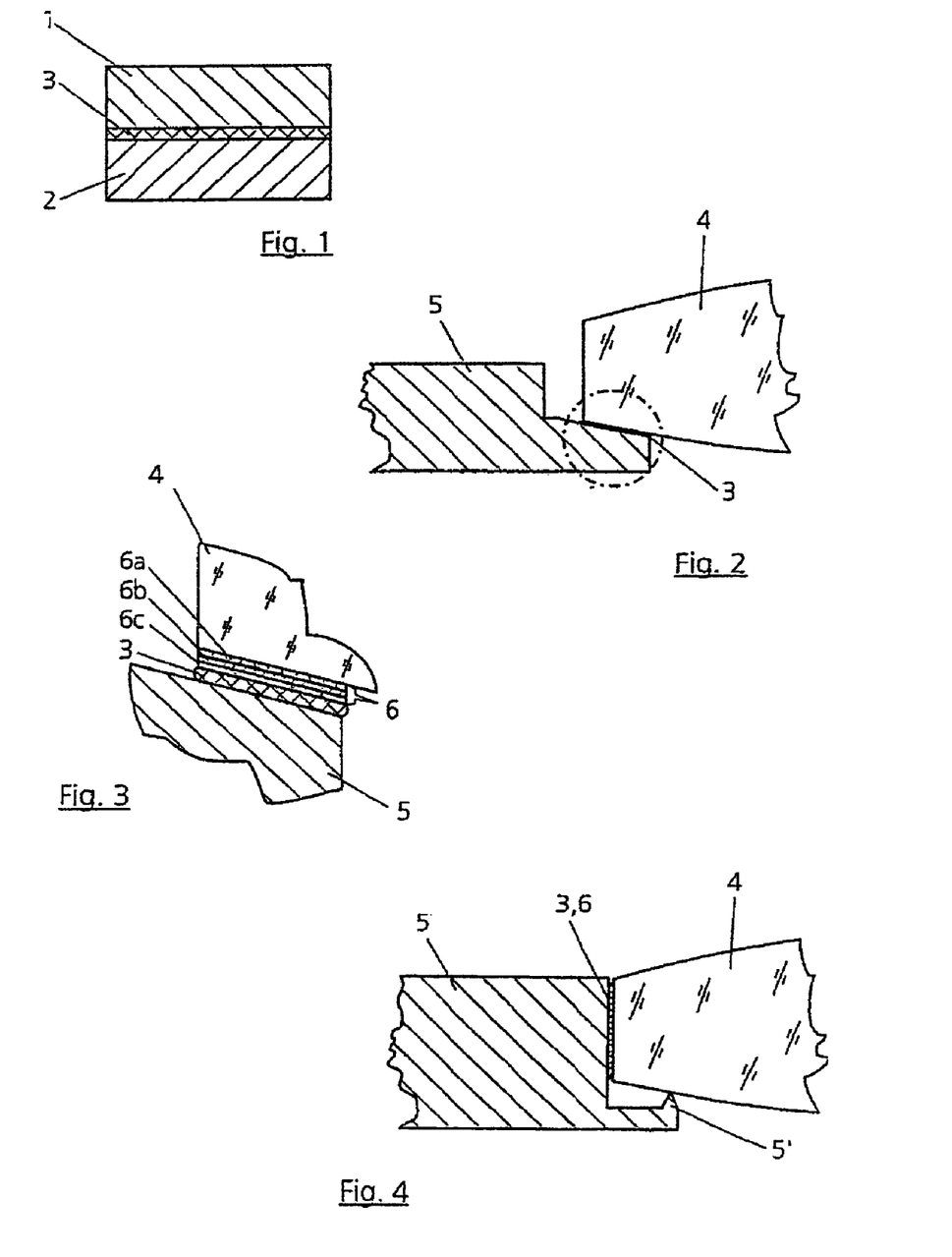
FIG. 1 shows a diagrammatic view explaining a principle of the present invention.
FIG. 2 shows a diagrammatic cross-sectional view explaining the connection according to the invention of a lens to a mount.
FIG. 3 shows an alternative exemplary embodiment of an assembly according to the invention in the form of an enlarged excerpt.
FIG. 4 shows an alternative exemplary embodiment for the connection according to the invention of a is lens to its mount.

FIG. 1 shows two diagrammatically indicated devices 1, 2 and a diffusion alloy 3 which has been formed between these two components 1, 2 and according to the exemplary embodiment has been formed at a processing temperature of approximately 20-25° C. (approximately room temperature) after dispersion of a gallium-tin alloy (as second component that is liquid at the processing temperature) with a copper powder (as first component that is solid at processing temperature), the mixture of substances comprising these components having been introduced between the two devices 1 and 2 in the unset state.

If a gallium alloy is used as material for the second component, the gallium content in the gallium alloy is preferably at least 75 percent by weight. In particular, the gallium content may preferably be selected in such a way that the mixing ratio in the gallium alloy substantially (i.e. apart from relative deviations of approximately 1 to 3 percent) corresponds to the mixing ratio of an eutectic mixture, which then results in the minimum solidification temperature of the mixture. A relative gallium content of this nature in the gallium alloy may typically be approximately 87 percent by weight for a gallium-tin (Ga—Sn) alloy, for example.

With regard to the relative ratio between the first and second components in the mixture of substances comprising the first component and the second component, it is preferable for the relative proportion of the second component (i.e. for example gallium or Ga—Sn) to be at least 35 percent by weight, and preferably in the range from 60 to 80 percent by weight, in order to achieve an optimum compromise between good processing properties (in the sense of a mixture of substances with a sufficiently low viscosity in the unset state) and, at the same time, sufficiently quick setting. If appropriate, however, relative gallium contents in the mixture of substances of up to approx. 90 percent by weight may also be considered.

At least one of the devices, e.g. the device 1, may be formed from a nonmetallic material and may in particular consist of an optically transparent material, for example of quartz glass (fused silica, $SiO_2$) or calcium fluoride ($CaF_2$). It may also be a metallic device (e.g. an aluminum mirror). The other device 2 may likewise be a metallic or nonmetallic device, in particular for example a metallic or ceramic mount.

Figure 8:
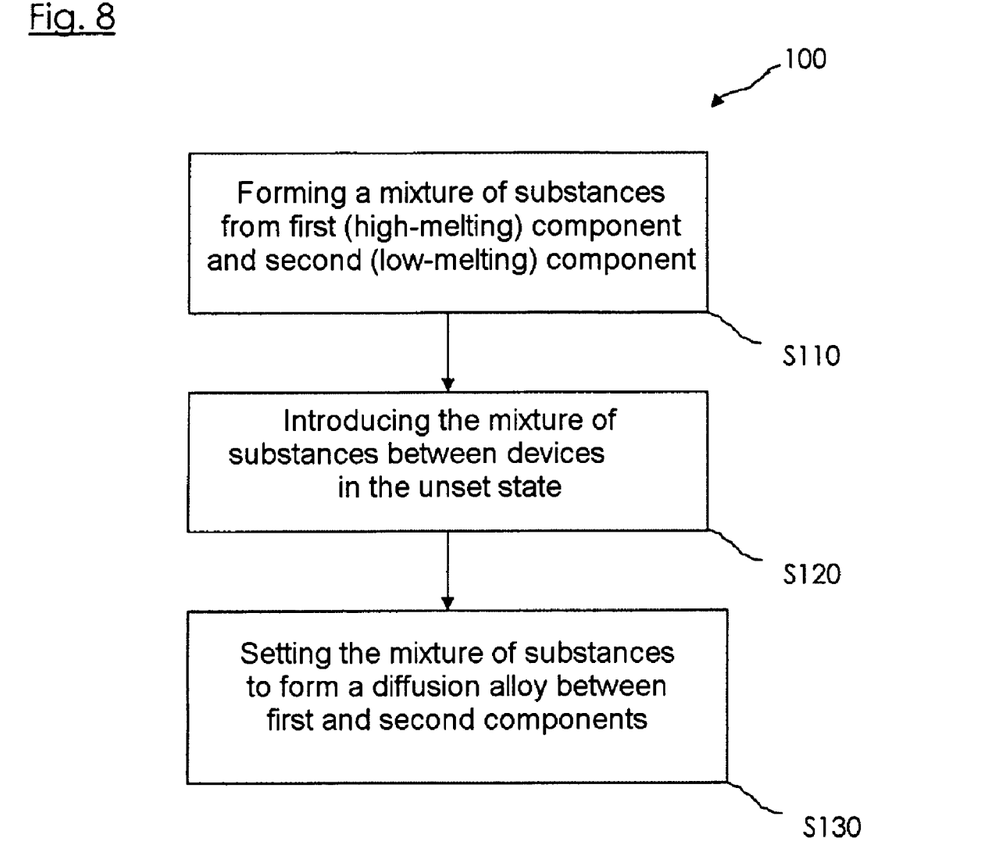
FIG. 8 shows a flow diagram explaining a preferred embodiment of a process according to the invention.

As can be seen from the flow diagram 100 shown in FIG. 8, to produce the fixed connection between the elements 1, 2, first of all, in a step S110, the mixture of substances is formed at the processing temperature from a first component (in the example: copper), which is solid at the processing temperature, and a second component (in the example: Ga-tin alloy), which is liquid at the processing temperature, it being possible for the first component to be dispersed, in particular in the form of small particles, platelets or flakes, in the second component. In this case, the particle size of the particles of the first component (e.g. Cu particles) is preferably coarse, in the range from (10-100) μm, and may in particular be approximately (30-60) μm, even more preferably (40-50) μm.

In a subsequent step S120, the mixture of substances is introduced between the two devices 1 and 2 in the unset state. In step S130, the mixture of substances is set so as to form a diffusion alloy 3 from the first and second components.

The mixture of substances is not restricted to a mixture of two components, but rather it is also possible for more components, in particular further suitable metals or metal alloys, to be mixed with one another.

In an alternative process, in accordance with the flow diagram 200 illustrated in FIG. 9, it is possible, after coating, which takes place first in a step S210, of at least one of the devices 1, 2 with the first (relatively high-melting) component, e.g. copper, in the region of an intended joining location, for the joining location, in a step S220, to be covered, for example, with a foil of the second (relatively low-melting) component, e.g. gallium or a gallium alloy, below the melting temperature of the second component, after which, in a step S230, the two devices 1, 2 are brought into contact in the region of the joining location. This is followed by formation of the diffusion alloy 3 in step S250, either by diffusion which takes place below the melting temperature of the second component or after an optional intervening heating step S240 to or beyond the melting temperature of the second component.

In this case, for example, foil thicknesses in the range from (10-100) μm, preferably (30-60) μm, are suitable for the foil made from the material of the second low-melting component. The thickness of the layer of the first component (e.g. copper layer), applied to the devices 1, 2 for example by electroplating, may for example be in the range from (10-100) μm, preferably approximately (30-60) μm, even more preferably approximately (40-50) μm.

Depending on the specific conditions, in the case of the process illustrated in FIG. 9, it is also possible that it may be sufficient for just one of the two devices 1, 2 to be coated with the material of the first component if the second component is subsequently introduced to form a diffusion alloy for the fixed, permanent connection between the devices 1, 2 in a manner which is stable in the long term.

Figure 9:
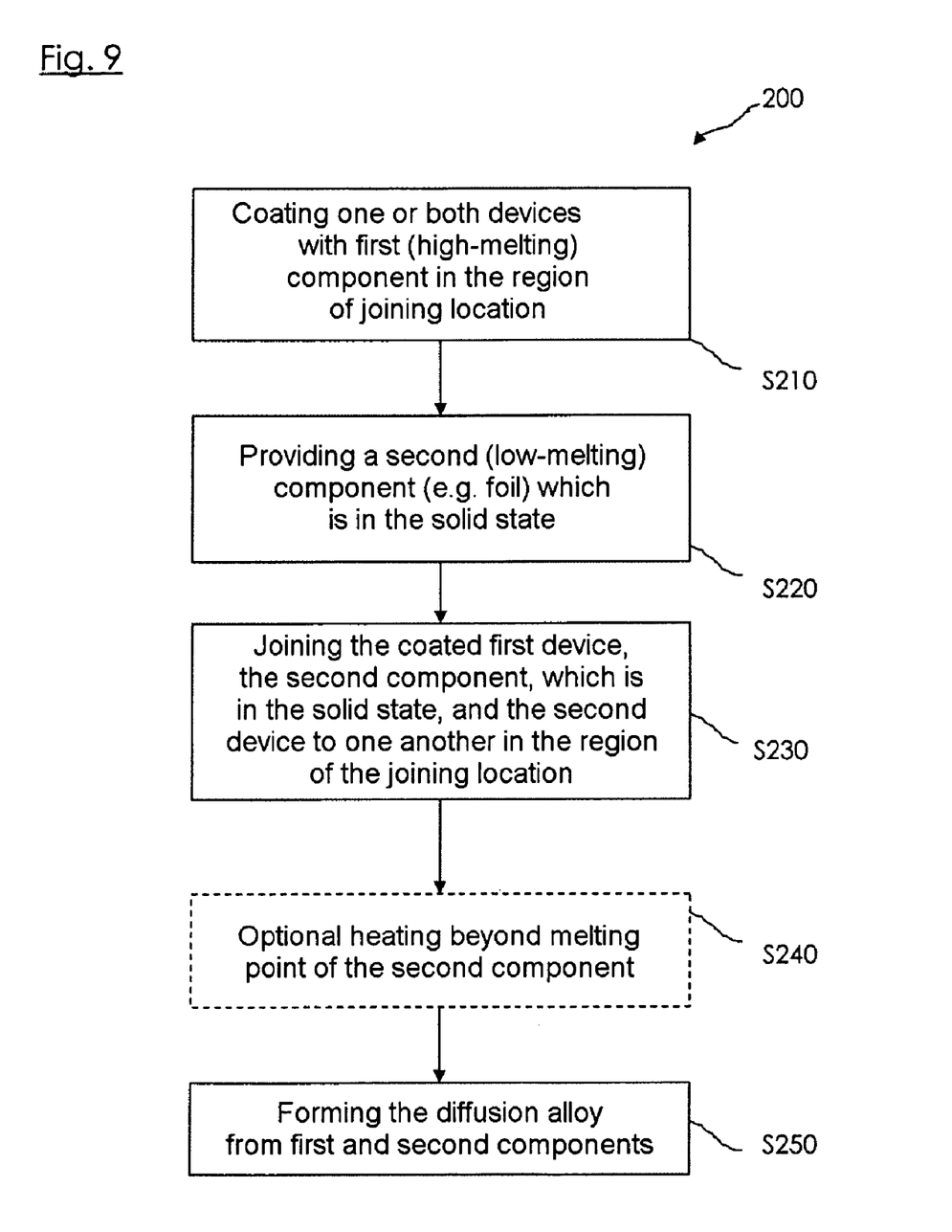
FIG. 9 shows a flow diagram explaining an alternative embodiment of a process according to the invention.

In a further embodiment, as a modification to the process illustrated in FIG. 9, it is also possible for the assembly illustrated in FIG. 1 to be produced by, after step S210 of coating the devices 1, 2 (or only one of the devices 1, 2), wetting the surface(s) coated in this way with the second (relatively low-melting) component, e.g. gallium, more or less immediately before the devices are joined together, so that the diffusion alloy can form after the devices have been joined together.

In accordance with FIG. 2, the diffusion alloy 3 formed in accordance with the invention from the mixture of substances produces a fixed connection between a lens 4, for example made from quartz glass ($SiO_2$) or calcium fluoride ($CaF_2$), into a mount 5 formed from metallic, ceramic or other suitable material.

As can be seen from FIG. 3, the lens 4 may also be provided with a layer structure 6, which is illustrated diagrammatically and on an exaggerated scale and may include, in succession starting from the lens 4, a bonding layer 6a (e.g. of chromium), a diffusion barrier layer 6b (e.g. of nickel) and a further metallic layer 6c (e.g. of gold). The use of gold as the terminating layer is recommended since gold prevents oxidation of the layers behind it and is itself scarcely oxidized at all. The layer structure 6 may also comprise fewer or more layers 6a-6c of this type and may in particular comprise different combinations and sequences of the layers 6a-6c. In the embodiment illustrated, the diffusion alloy 3, which connects the two devices 4, 5 to one another, is arranged between the metallic layer 6c and the mount 5.

In accordance with the exemplary embodiment illustrated in FIG. 4, it is also possible for the bearing of the lens 4 to be implemented on corresponding bearing elements 5' and to be decoupled to a certain extent from the connection by means of the diffusion alloy 3 or the layer structure 6, which may be advantageous in that the geometry of the bearing elements 5', which are adapted to holding the lens 4, is not affected by the diffusion alloy 3. The diffusion alloy 3 which is formed after accurate alignment of the lens 4 fixes the lens 4 in the position defined by the bearing elements 5'.

According to one exemplary embodiment of the invention, therefore, prior to the formation of the diffusion alloy 3 according to the invention, the optical element (e.g. the lens 4) which is to be connected to the mount is aligned in the mount and in this case preferably held in a position defined by the bearing elements. The alignment of the optical element may take place, for example, by means of the rolling-in process which is known per se, as described for example in DE 102 11 791 A1. Furthermore, it is then preferable for the aligned optical element, after the setting of the diffusion alloy 3, to be fixed in the position defined by the bearing elements. The invention therefore also relates to an assembly produced by said process.

Figure 5:
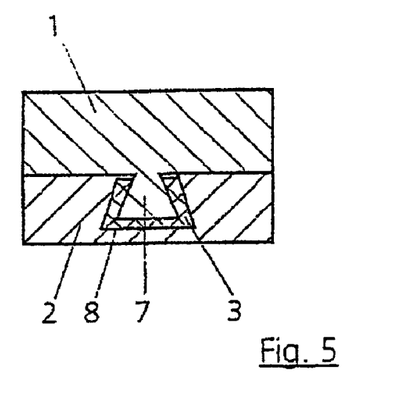
FIG. 5 shows an exemplary embodiment of a positively locking connection according to the invention between two devices.

FIG. 5 shows an alternative embodiment which is suitable for forming a positively locking connection between the two devices 1, 2. In this case, a connecting element 7, which is in this case formed integrally with the device 1 in the style of a projection that narrows in the direction of the device 1, is arranged on the first device 1. A connecting element 8 which complements the connecting element 7 of the device 1 is formed in the device 2. The connecting element 8 of the device 2 is in this case formed as a hole which narrows in the direction of the device 1. The smallest diameter of the conically formed hole 8 and the largest diameter of the conically formed connecting element 7 are designed in such a way that the connecting elements 7, 8 of the two devices 1, 2 can be fitted into one another. Only when the hole 8 is filled with the mixture of substances and then the connecting element 7 is introduced into the hole which has been partially filled with the mixture of substances is a positive lock produced between the two connecting elements 7, 8 and therefore between the devices 1, 2 after the setting of the mixture of substances.

Figure 6:
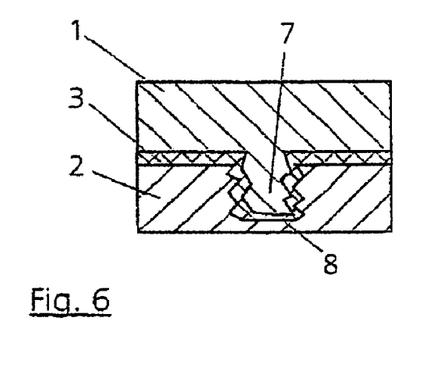
FIG. 6 shows a further exemplary embodiment of a positively locking and/or cohesive connection according to the invention between two devices.

FIG. 6 shows a combination in which the connection has been realized by cohesion between the planar surfaces of the devices 1, 2 and the diffusion alloy 3 introduced between them and by a positive lock between the respective connecting elements 7, 8, which are in this case formed as a toothed hole 8 and a toothed projection 7, and the diffusion alloy 3. In particular, the hole and the projection may in each case be a threaded hole and a projection provided with a screw thread. The diffusion alloy 3 according to the invention can therefore also be used in general terms for the introduction of, for example, threaded sleeves for the connection of devices.

Figure 7:
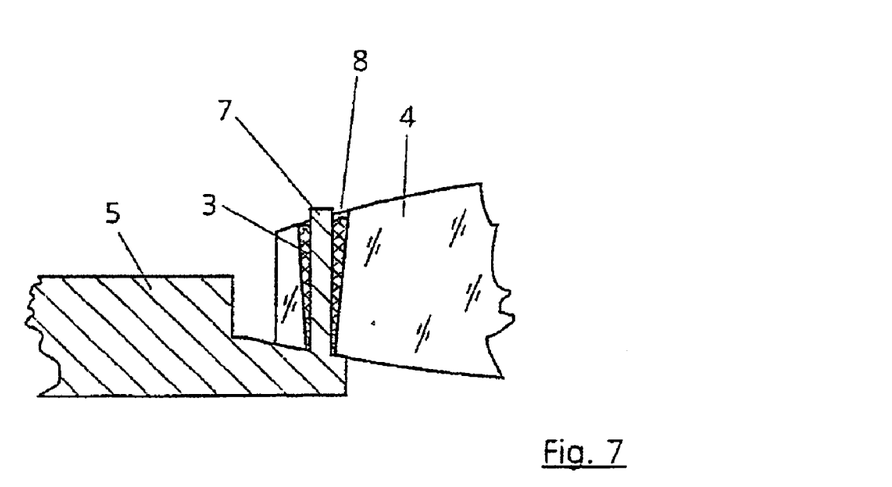
FIG. 7 shows a further exemplary embodiment of a positively locking and/or cohesive connection according to the invention between a lens and its mount.

In accordance with the exemplary embodiment illustrated in FIG. 7, the mount 5 has a plurality of connecting elements 7, which are realized as pins attached to or formed integrally with the mount 5, in which case the pins may consist of a metallic material in particular in the region of their surface.

In the region of the pins serving as connecting elements 7, the lens 4 has corresponding holes 8 as connecting elements. In a particularly expedient embodiment as shown in FIG. 7, the holes are conical in form, widening in the direction of their end facing away from the mount 5. The smallest diameter of the holes is still large enough for it to be possible to accurately align the position of the lens 4 prior to the connection operation. After this accurate alignment of the lens 4, the holes can be filled with the mixture of substances. The diffusion alloy 3 which is formed in accordance with the invention then forms a cohesive connection to the pins, and the lens 4 is then held securely and accurately in position by positive locking between the holes and the combination of pins and the diffusion alloy 3.

Therefore, there is a wide range of new possible ways of connecting the devices 1, 2, 4, 5 to one another without stresses and contamination and with long-term stability using the diffusion alloy formed in accordance with the invention, in particular also by using various combinations of the exemplary embodiments described above, or by combining and/or exchanging individual features of embodiments which have been described.

Figure 10:
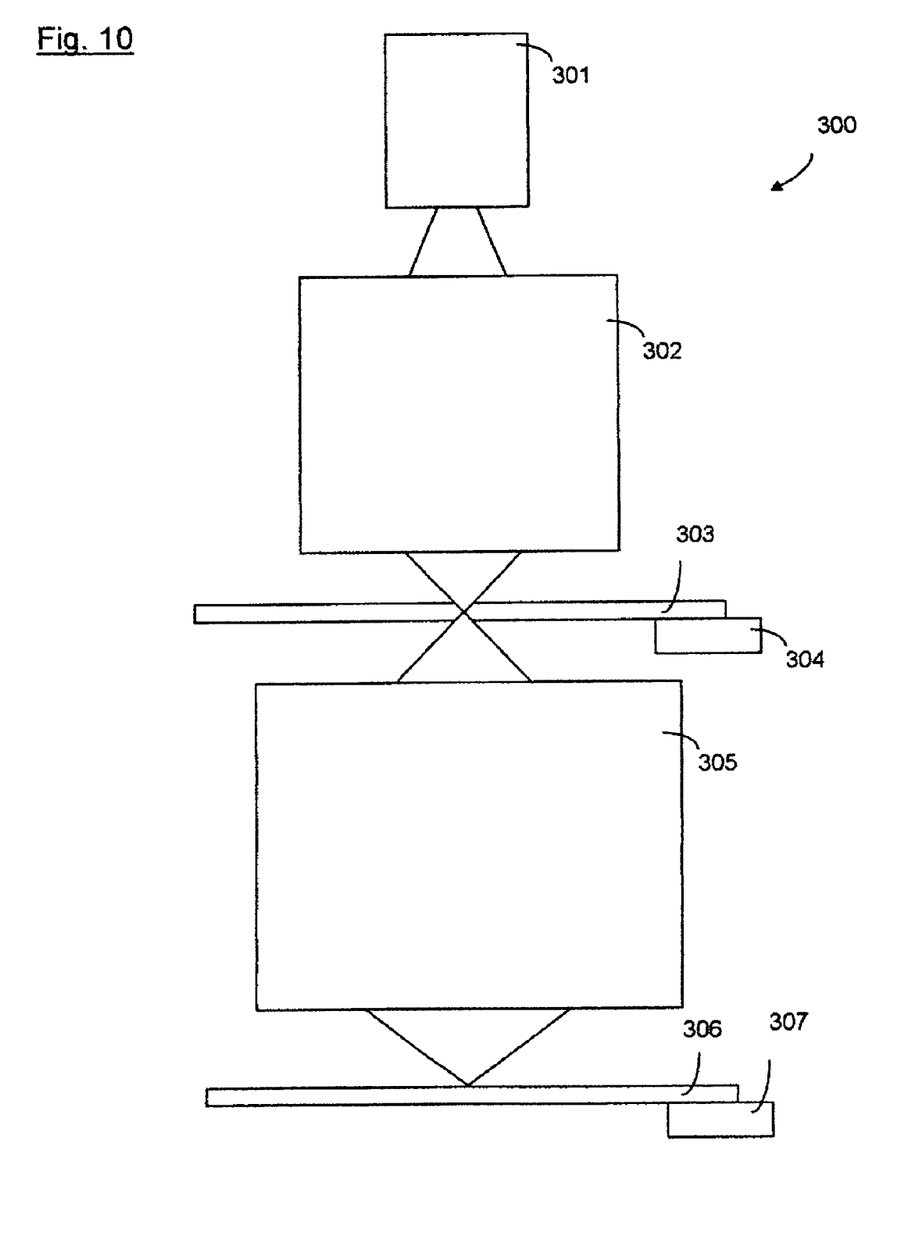
FIG. 10 diagrammatically depicts the basic structure of a microlithographic projection exposure apparatus having a projection objective, in which one or more assemblies according to the invention may in particular be used.

FIG. 10 diagrammatically depicts the basic structure of a microlithographic projection exposure apparatus having a projection objective in which one or more assemblies according to the invention may be used.

In accordance with FIG. 10, a microlithographic projection exposure apparatus 300 has a light source 301, an illumination system 302, a mask (reticle) 303, a mask carrier unit 304, a projection objective 305, a substrate 306 which includes light-sensitive structures or a light-sensitive layer, and a substrate carrier unit 307. In FIG. 10, the path of two rays of light delimiting a light beam from the light source 301 to the substrate 306 is diagrammatically depicted between these various components.

The image of the mask 303 which has been illuminated by means of the illumination system 302 is in this case projected by means of the projection objective 305 onto the substrate 306 (e.g. a silicon wafer), which has been coated with a light-sensitive layer (photoresist) and is arranged in the image plane of the projection objective 305, in order for the mask pattern to be transferred to the light-sensitive coating of the substrate 306.

The invention is suitable in particular for connecting optical devices to mounts or mount components, e.g. within the illumination system 302 and/or within the projection objective 305 of the microlithographic projection exposure apparatus 300.

Although the invention has also been described on the basis of specific embodiments, a person skilled in the art will also infer numerous variations and alternative embodiments, e.g. by combining and/or exchanging features of individual embodiments. Accordingly, it will be readily understood by a person skilled in the art that these variations and alternative embodiments are also encompassed by the present invention, and the scope of the invention is restricted only by the appended patent claims and their equivalents.

The invention claimed is:

1. A process for connecting an optical element of a microlithographic projection exposure apparatus to a mount having bearing elements for bearing the optical element, the process comprising:
    a) forming a substance mixture at a processing temperature from at least a first component, which is solid at the processing temperature, and a second component, which is liquid at the processing temperature, the first component being dispersed in the second component;
    b) introducing the substance mixture in the unset state between the optical element and the mount; and
    c) setting the substance mixture so as to form a diffusion alloy from the first and second components.

2. The process of claim 1, wherein prior to the formation of the diffusion alloy, the optical element is aligned in the mount and held in a position defined by the bearing elements.

3. The process of claim 2, wherein after the setting of the diffusion alloy, the aligned optical element is fixed in the position defined by the bearing elements.

4. A process for connecting two devices, of which one device is an optical element of a microlithographic projection exposure apparatus and the other device is a mount having bearing elements for bearing this optical element, the process comprising:
    a) coating at least one first device of the devices in the region of an intended joining location with a first component which has a first melting temperature;
    b) providing a second component, which is in the solid state and has a second melting temperature that is lower than the first melting temperature; and
    c) joining together the first device, which has been coated with the first component, the second component, which is in the solid state, and the second device in the region of the joining location, in such a manner as to form a diffusion alloy from the first and second components, the diffusion alloy having a melting temperature which is higher than the second melting temperature.

5. The process of claim 4, wherein the temperature of the arrangement comprising the devices and the mount is increased by less than 10° C. during steps a) to c).

6. The process of claim 4, wherein a maximum temperature of the arrangement comprising the devices of 50° C. is not exceeded during steps a) to c).

7. The process of claim 4, wherein the processing temperature or the temperature during the formation of the diffusion alloy is less than 35° C.

8. The process of claim 4, wherein the diffusion alloy is formed in direct contact with the optical element.

9. The process of claim 4, wherein in step a) both devices are coated with the first component in the region of the joining location.

10. The process of claim 4, wherein in step b) the second component, which is in the solid state, is provided in the form of a foil.

11. The process of claim 4, wherein the formation of the diffusion alloy takes place after heating to or beyond the melting temperature of the second component.

12. The process of claim 4, wherein the formation of the diffusion alloy takes place at a temperature below the melting temperature of the second component.

13. The process of claim 4, wherein the second component is or comprises gallium (Ga) or a gallium alloy.

14. The process of claim 13, wherein the gallium alloy used is a gallium-tin (Ga—Sn) alloy or a gallium-indium (Ga—In) alloy.

15. The process of claim 13, wherein the gallium content of the gallium alloy is at least 75% by weight.

16. The process of claim 13, wherein the gallium content of the gallium alloy is selected in such a way that substantially an eutectic mixture is formed.

17. The process of claim 4, wherein the first component used is a material with a face-centered cubic crystal structure.

18. The process of claim 4, wherein the first component used is copper (Cu) or material containing copper.

19. The process of claim 4, wherein the first component used is nickel (Ni), gold (Au), silver (Ag) or palladium (Pd) or a material containing at least one of these elements.

20. The process of claim 4, wherein the first component used is a substantially stainless or corrosion-resistant steel.

21. The process of claim 4, wherein the second component forms at least 35 percent by weight of the mixture of substances comprising at least the first component and the second component.

22. The process of claim 4, wherein the optical element, prior to step c), is provided with a layer structure comprising a bonding layer or a diffusion barrier or a metallic layer, and the diffusion alloy in step c) is formed in the region of the layer structure.

23. The process of claim 4, wherein the optical element substantially comprises an optically transparent material.

24. The process of claim 4, wherein the optical element is substantially formed from a nonmetallic material.

25. The process of claim 4, wherein the optical element is a lens, a mirror, a prism or a diffractive optical element.

26. The process of claim 4, wherein at least one of the devices, the optical element, and the mount, substantially comprises a ceramic material.

27. The process of claim 4, wherein at least one of the devices, the optical element, and the mount, substantially comprises a crystalline material.

* * * * *

UNITED STATES PATENT AND TRADEMARK OFFICE
CERTIFICATE OF CORRECTION

PATENT NO.         : 7,551,375 B2                                        Page 1 of 1
APPLICATION NO. : 11/386236
DATED              : June 23, 2009
INVENTOR(S)       : Johannes Rau et al.

It is certified that error appears in the above-identified patent and that said Letters Patent is hereby corrected as shown below:

Column 8, line 37, after "a" delete "is".

Column 8, line 56, delete "DESRIPTION" insert --DESCRIPTION--.

Signed and Sealed this

Eighteenth Day of August, 2009

David J. Kappos
*Director of the United States Patent and Trademark Office*